United States Patent
Lee et al.

(10) Patent No.: US 9,723,737 B2
(45) Date of Patent: Aug. 1, 2017

(54) ELECTRONIC DEVICE HAVING WATERPROOF STRUCTURE

(71) Applicant: Samsung Electronics Co., Ltd., Suwon-si, Gyeonggi-do (KR)

(72) Inventors: Seung-Hoon Lee, Seoul (KR); Chang-Youl Lee, Seoul (KR); Tae-Doo Choung, Gwangju-si (KR); Young-Sik Choi, Seoul (KR); Sung-Kyu Hwang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 14/590,325

(22) Filed: Jan. 6, 2015

(65) Prior Publication Data

US 2015/0195927 A1   Jul. 9, 2015

Related U.S. Application Data

(60) Provisional application No. 61/924,452, filed on Jan. 7, 2014.

(30) Foreign Application Priority Data

Apr. 7, 2014 (KR) .......................... 10-2014-0041231

(51) Int. Cl.
| | |
|---|---|
| *H05K 5/02* | (2006.01) |
| *H05K 1/14* | (2006.01) |
| *G06F 1/16* | (2006.01) |
| *H04M 1/02* | (2006.01) |
| *H04M 1/18* | (2006.01) |

(52) U.S. Cl.
CPC ......... *H05K 5/0247* (2013.01); *G06F 1/1656* (2013.01); *H04M 1/0274* (2013.01); *H04M 1/0277* (2013.01); *H04M 1/18* (2013.01); *H05K 1/147* (2013.01)

(58) Field of Classification Search
CPC ..... H05K 5/0247; H05K 1/147; G06F 1/1656
See application file for complete search history.

(56) References Cited

U.S. PATENT DOCUMENTS

| | | | | |
|---|---|---|---|---|
| 6,728,519 B1 * | 4/2004 | Okuda | ................ | H04M 1/0266 455/347 |
| 7,130,184 B2 | 10/2006 | Choi | | |
| 7,466,558 B2 * | 12/2008 | Yasuda | ............... | H04M 1/0216 361/752 |
| 7,869,206 B2 * | 1/2011 | Dabov | .................. | G06F 1/1626 361/679.55 |
| 8,415,570 B2 * | 4/2013 | Dabov | .................. | G06F 1/1656 174/520 |

(Continued)

FOREIGN PATENT DOCUMENTS

KR   20130097557 A   * 9/2013

*Primary Examiner* — Jeremy C Norris
*Assistant Examiner* — Nathan Milakovich
(74) *Attorney, Agent, or Firm* — Jefferson IP Law, LLP

(57) ABSTRACT

An electronic device is provided. The electronic device includes an electronic component connected to a Printed Circuit Board (PCB), a housing comprising a recess configured to accommodate the electronic component and a hole formed in at least part of the recess to pass the PCB, and a sealing member disposed in at least part of the hole and configured to cover at least part of the PCB.

18 Claims, 16 Drawing Sheets

(56) References Cited

U.S. PATENT DOCUMENTS

| | | | |
|---|---|---|---|
| 8,559,650 B2 | 10/2013 | Seo | |
| 8,867,198 B2 * | 10/2014 | Steele | A45C 11/00 206/320 |
| 9,323,292 B2 * | 4/2016 | Bae | H04M 1/18 |
| 9,407,048 B2 * | 8/2016 | George | H01R 13/72 |
| 2005/0272401 A1 * | 12/2005 | Zatezalo | G06F 1/163 455/347 |
| 2006/0063572 A1 * | 3/2006 | Garcia | H01R 13/5205 455/575.3 |
| 2011/0090652 A1 * | 4/2011 | Wee | H05K 5/069 361/749 |
| 2011/0091063 A1 | 4/2011 | Lee | |
| 2011/0216911 A1 | 9/2011 | Kang | |
| 2013/0089216 A1 | 4/2013 | Han | |
| 2013/0293073 A1 * | 11/2013 | Tsai | H05K 5/061 312/229 |
| 2014/0262847 A1 * | 9/2014 | Yang | A45C 11/00 206/37 |
| 2014/0353179 A1 * | 12/2014 | Kim | A45C 11/00 206/37 |
| 2015/0208535 A1 * | 7/2015 | Wu | G06F 1/1626 312/223.1 |
| 2016/0239047 A1 * | 8/2016 | Weber | G06F 1/1656 |
| 2016/0349707 A1 * | 12/2016 | Huang | G04B 37/1486 |

\* cited by examiner

ELECTRONIC DEVICE HAVING WATERPROOF STRUCTURE

CROSS-REFERENCE TO RELATED APPLICATION(S)

The application claims the benefit under 35 U.S.C. §119 (e) of a U.S. Provisional application filed on Jan. 7, 2014 in the United States Patent and Trademark Office and assigned Ser. No. 61/924,452 and under 35 U.S.C. §119(a) of a Korean patent application filed on Apr. 7, 2014 in the Korean Intellectual Property Office and assigned Serial number 10-2014-0041231, the entire disclosure of each of which is hereby incorporated by reference.

TECHNICAL FIELD

The present disclosure relates to an electronic device. More particularly, the present disclosure relates to an electronic device having a waterproof structure.

BACKGROUND

In accordance with advances of multimedia technology, electronic devices having various functions are emerging. Such electronic devices generally include a convergence function which combines more than one function.

Mobile terminals, which are called smart phones, are dominant among such electronic devices. In particular, the mobile terminal includes a touch-type large display module and a high-pixel camera module in addition to a basic communication function with the other party to capture a still-picture and a moving-picture. Also, the mobile terminal may play multimedia content such as music and video, and may be used to surf the web by accessing a network. The mobile terminals are advancing to accelerate various convergence functions using a high-performance processor such that the main communication function with the other party is treated as an additional function.

In response to the functional diversity, the electronic device has a changing mechanical structure. For example, the electronic device has become slimmer, lightweight, and simple, in order to maximize the mobility with the same or better functionality, and facilitate the mobile device's use.

Currently, the electronic device has a basic waterproof function for protecting the mobile device from water, and concentrates on the structural improvement to achieve good waterproof function, better assembly, and manufacturing cost reduction.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electronic device having a waterproof structure.

Another aspect of the present disclosure is to provide an electronic device having a waterproof structure to improve assembling.

Another aspect of the present disclosure is to provide an electronic device having a waterproof structure to slim the device with a waterproof function.

Another aspect of the present disclosure is to provide an electronic device having a waterproof structure to reduce a manufacturing cost.

In accordance with an aspect of the present disclosure, an electronic device is provided. The electronic device includes an electronic component connected to a Printed Circuit Board (PCB), a housing comprising a recess configured to accommodate the electronic component and a hole formed in at least part of the recess to pass the PCB, and a sealing member disposed in at least part of the hole and configured to cover at least part of the PCB.

In accordance with another aspect of the present disclosure, an electronic device is provided. The electronic device includes a housing configured to form at least part of an exterior of the electronic device, at least one electronic component disposed in an outer side of the housing, an electrical connector configured to electrically connect the electronic component into the electronic device by passing through the housing, and a sealing member configured to seal a passage of the electrical connector of the housing.

In accordance with another aspect of the present disclosure, an electronic device is provided. The electronic device includes a housing comprising an outer side which forms at least part of an exterior of the electronic device, and an inner side which is opposed to the outer side and faces an interior of the electronic device, a recess formed in the outer side of the housing and comprising a through hole of which at least part is connected into the electronic device, at least one electronic component received in the recess, an electrical connector electrically connected to the electronic component with one end, and electrically connected into the electronic device by passing through the through hole with the other end, and a sealing member configured to seal the through hole after the at least one electronic component is mounted in the recess.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1A:
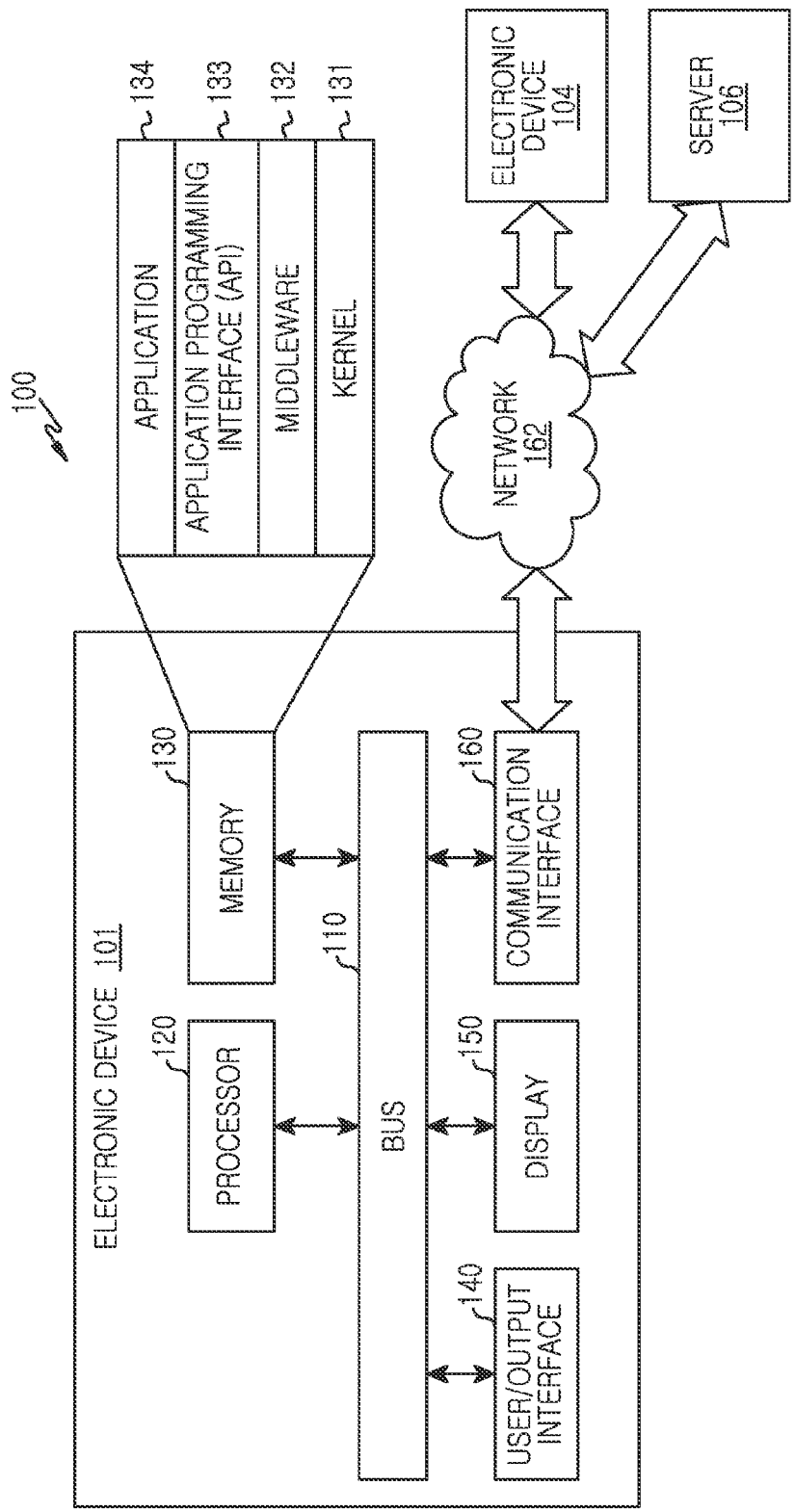
FIG. 1A is a diagram of a network environment including an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein may be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

An electronic device according to the present disclosure may employ a device having a communication function. The electronic device may include at least one of, for example, a smart phone, a tablet Personal Computer (PC), a mobile phone, a video phone, an e-book reader, a desktop PC, a laptop PC, a netbook computer, a Personal Digital Assistant (PDA), a Portable Multimedia Player (PMP), an MP3 player, a mobile medical appliance, a camera, and a wearable device (e.g., Head-Mounted-Device (HMD) such as electronic glasses, e-textiles, electronic bracelet, electronic necklace, electronic accessory, electronic tattoo, and smartwatch).

The electronic device may employ a smart home appliance having the communication function. The smart home appliance may include at least one of, for example, a television, a Digital Versatile Disc (DVD) player, an audio system, a refrigerator, an air conditioner, a vacuum, an oven, a microwave oven, a washing machine, an air purifier, a set-top box, a TV box (e.g., Samsung HomeSync™, AppleTV™, Google TV™), a game console, an electronic dictionary, an electronic key, and a digital frame.

The electronic device may employ at least one of medical appliances (e.g., Magnetic Resonance Angiography (MRA), Magnetic Resonance Imaging (MRI), Computed Tomography (CT), X-ray, ultrasonicator)), a navigation device, a Global Positioning System (GPS) recess, an Event Data Recorder (EDR), a Flight Data Recorder (FDR), an in-vehicle infotainment device, marine electronic equipment (e.g., marine navigation device and gyro compass), avionics, a security device, a vehicle head unit, an industrial or home robot, an Automatic Teller's Machine (ATM) of a financial company, and a Point of Sale (POS) of a store.

The electronic device may employ at least one of part of furniture or building/structure having the communication function, an electronic board, an electronic signature accommodating device, a projector, and various gauges (e.g., gauges for water, electricity, and radio wave). The electronic device may include one or a combination of those various devices. The electronic device may be a flexible device. Those skilled in the art shall understand that the electronic device of the present disclosure is not limited those devices.

Hereinafter, various embodiments of the present disclosure provide an electronic device. The term 'user' may represent a person or a device (e.g., artificial intelligent electronic device) who or which uses the electronic device.

FIG. 1A is a diagram of a network environment including an electronic device according to an embodiment of the present disclosure.

Referring to FIG. 1A, a network environment 100 includes an electronic device 101. The electronic device 101 may include a bus 110, a processor 120, a memory 130, an input/output interface 140, a display 150, and a communication interface 160, but is not limited thereto.

The bus 110 may be a circuit for interlinking the above-stated components and transferring communication (e.g., control messages) between the above-stated components.

The processor 120 may receive an instruction from the other components (e.g., the memory 130, the input/output interface 140, the display 150, and the communication interface 160) via the bus 110, interpret the received instruction, and perform an operation or a data processing according to the interpreted instruction.

The memory 130 may store the instruction and the data received from or generated by the processor 120 or the other components (e.g., the user input module 140, the display 150, and the communication interface 160). For example, the memory 130 may include programming modules including, for example, a kernel 131, a middleware 132, an Application Programming Interface (API) 133, and an application 134. The programming modules may be implemented using software, firmware, and hardware, or a combination of at least two of them.

The kernel 131 may control or manage system resources (e.g., the bus 110, the processor 120, or the memory 130) used to execute the operation or the function of the other programming modules, for example, the middleware 132, the API 133, or the application 134. Also, the kernel 131 may provide an interface allowing the middleware 132, the API 133, and/or the application 134 to access and to control or manage the individual component of the electronic device 101.

The middleware 132 may relay data between the API 133 and/or the application 134 and the kernel 131. In response to work requests received from the application 134, the middleware 132 may, for example, control the work requests (e.g., scheduling or load balancing) by giving priority of the system resource (e.g., the bus 110, the processor 120, or the memory 130) of the electronic device 101 to at least one application of the application 134.

The API 133, which is an interface for the application 134 to control the function provided from the kernel 131 or the middleware 132, may include at least one interface or function (e.g., instruction) for, for example, file control, window control, image processing, or text control.

The application 134 may include a Short Message Service (SMS)/Multimedia Messaging Service (MMS) application, an e-mail application, a calendar application, an alarm application, a health care application (e.g., an application for measuring an exercise or a blood sugar), or an environment information application (e.g., an application for providing air pressure, humidity, or temperature information). Additionally or substantially, the application 134 may be an application relating to information exchange between the electronic device 101 and an external electronic device (e.g., an electronic device 104). The information exchange application may include, for example, a notification relay application for relaying particular information to the external electronic device, or a device management application for managing the external electronic device.

For example, the notification relay application may relay notification information of the other application (e.g., the SMS/MMS application, the e-mail application, the health care application, or the environment information application) of the electronic device 101 to the external electronic device (e.g., the electronic device 104). Additionally or substantially, the notification relay application may receive and provide the notification information from the external electronic device (e.g., the electronic device 104) to the user. The device management application may manage (e.g., install, delete, or update) at least part of the function (e.g., turn-on/turn-off of the external electronic device (or some components) or display brightness (or resolution) control) of the external electronic device (e.g., the electronic device 104) communicating with the electronic device 101, the application running on the external electronic device, or a service (e.g., a call service or a message service) provided by the external electronic device.

The application 134 may include an application designated based on an attribute (e.g., a type of the electronic device) of the external electronic device (e.g., the electronic device 104). For example, when the external electronic device is an MP3 player, the application 134 may include an application relating to music play. Similarly, when the external electronic device is a mobile medical device, the application 134 may include an application relating to health care. The application 134 may include at least one of the application designated in the electronic device 101 or the application received from the external electronic device (e.g., a server 106 or the electronic device 104).

The input/output interface 140 may forward the instruction and/or the data input from the user through an input/output device (e.g., a sensor, a keyboard, or a touch screen) to the processor 120, the memory 130, and the communication interface 160, for example, via the bus 110. For example, the input/output interface 140 may forward the data of user's touch input through the touch screen, to the processor 120. Also, the input/output interface 140 may output the instruction or the data received from the processor 120, the memory 130, and the communication interface 160, for example, via the bus 110, through the input/output device (e.g., a speaker and/or a display). For example, the input/output interface 140 may output voice data processed by the processor 120 to the user through the speaker.

The display 150 may display various information (e.g., multimedia data or text data) to the user.

The communication interface 160 may connect the communication between the electronic device 101 and the external device (e.g., the electronic device 104 or the server 106). For example, the communication interface 160 may communicate with the external device by accessing the network 140 using wireless communication or wired communication. The wireless communication may include at least one of, for example, Wireless Fidelity (Wifi), Bluetooth (BT), Near Field Communication (NFC), GPS, or cellular communication (e.g., Long Term Evolution (LTE), Long Term Evolution-Advanced (LTE-A), Code Division Multiple Access (CDMA), Wideband Code Division Multiple Access (WCDMA), Universal Mobile Telecommunications System (UMTS), Wireless Broadband (WiBro), or Global System for Mobile Communications (GSM)). The wired communication may include at least one of, for example, Universal Serial Bus (USB), High Definition Multimedia Interface (HDMI), Recommended Standard (RS) 232, and Plain Old Telephone Service (POTS).

The network 162 may be a telecommunications network. The telecommunications network may include at least one of a computer network, Internet, Internet of things, or a telephone network. A protocol (e.g., transport layer protocol, data link layer protocol, or physical layer protocol) for the communication between the electronic device 101 and the external device may be supported by at least one of the application 134, the application programming interface 133, the middleware 132, the kernel 131, and/or the communication interface 160.

An ear jack assembly and the ear jack assembly structure are explained as an electronic component of the electronic device 101. For example, the present disclosure may be applied to various electronic components disposed outside a housing of the electronic device 101 and electrically connected into the electronic device 101. Such electronic components may include at least one of a micro USB connector port, a general USB connector port, an ear jack assembly, a key button, a card slot for inserting an external card-type device, a HDMI connector port, a sensor module, and a microphone.

Figure 1B:
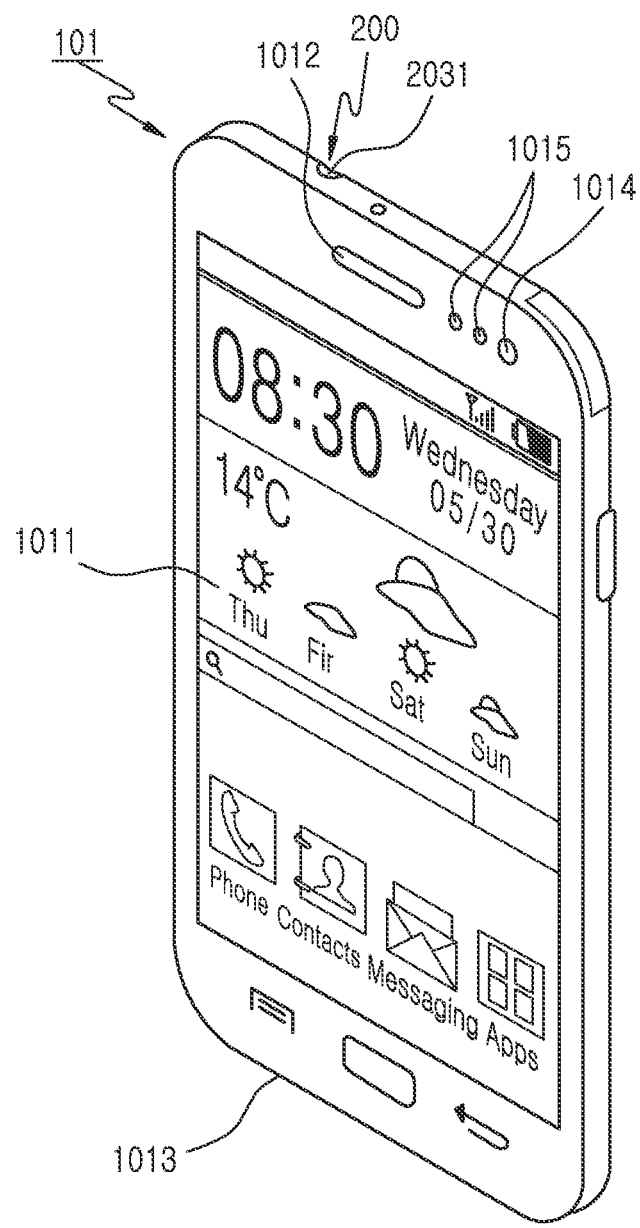
FIG. 1B is a front perspective view of an electronic device according to an embodiment of the present disclosure.

FIG. 1B is a front perspective view of an electronic device according to an embodiment of the present disclosure.

Referring to FIG. 1B, the electronic device 101 may include a display 1011, a speaker 1012, and a microphone 1013. The electronic device 101 may include a touch sensor for detecting an external object which contacts or approaches at least part of the electronic device 101. For example, the touch sensor may be an optically transparent touch screen disposed at a front side or a back side of the display 1011. For example, the touch sensor may be integrated with the display 1011.

Various functional components of the electronic device 101 may be disposed around the speaker 1012. The electronic device 101 may include a first camera 1014 in the front side. For example, the first camera 1014 may include an image sensor for detecting visible or invisible light. The image sensor may capture a subject outside the electronic device 101 or detect a motion of other external object. The electronic device 101 may include at least one sensor module 1015 for variably operating the electronic device 101 according to a surrounding environment. The sensor module 1015 may include a light sensor for detecting the ambient light and automatically adjusting the brightness of the display 1011 according the detected light and/or a proximity sensor for deactivating the display 1011 when detecting a user's head portion attached during the call.

Part of an ear jack assembly 200 may be exposed at the top of the electronic device 101. The ear jack assembly 200 may include an ear jack hole 2031 for accommodating an ear jack plug of an external speaker (e.g., an earphone).

Figure 1C:
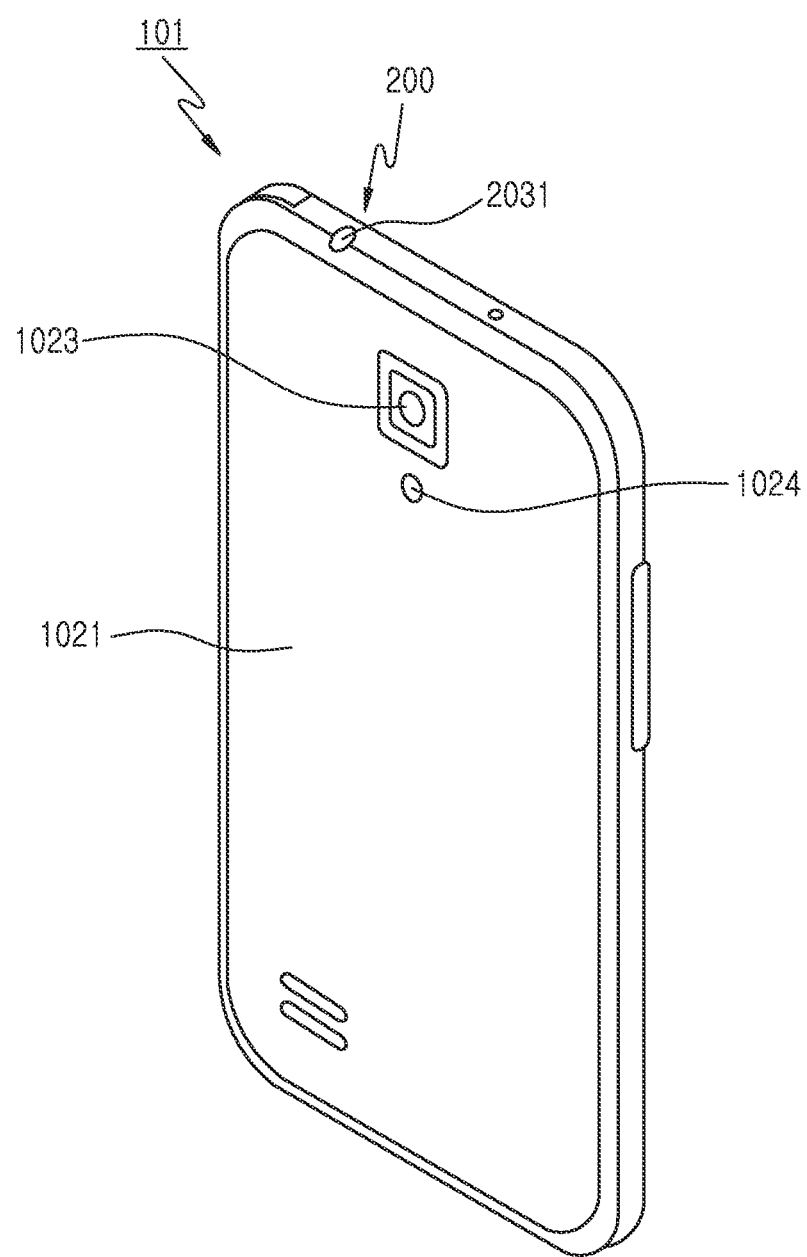
FIG. 1C is a rear perspective view of an electronic device according to an embodiment of the present disclosure.

FIG. 1C is a rear perspective view of an electronic device according to an embodiment of the present disclosure.

Referring to FIG. 1C, the electronic device 101 may include a second camera module 1023 at the back side 1021. A flash 1024 may be disposed below the second camera module 1023. The ear jack assembly 200 including the ear jack hole 2031 may be disposed at the top of the electronic device.

The ear jack assembly 200 may be disposed at the top of the electronic device, or at least part of the bottom and the sides of the electronic device.

Figure 2:
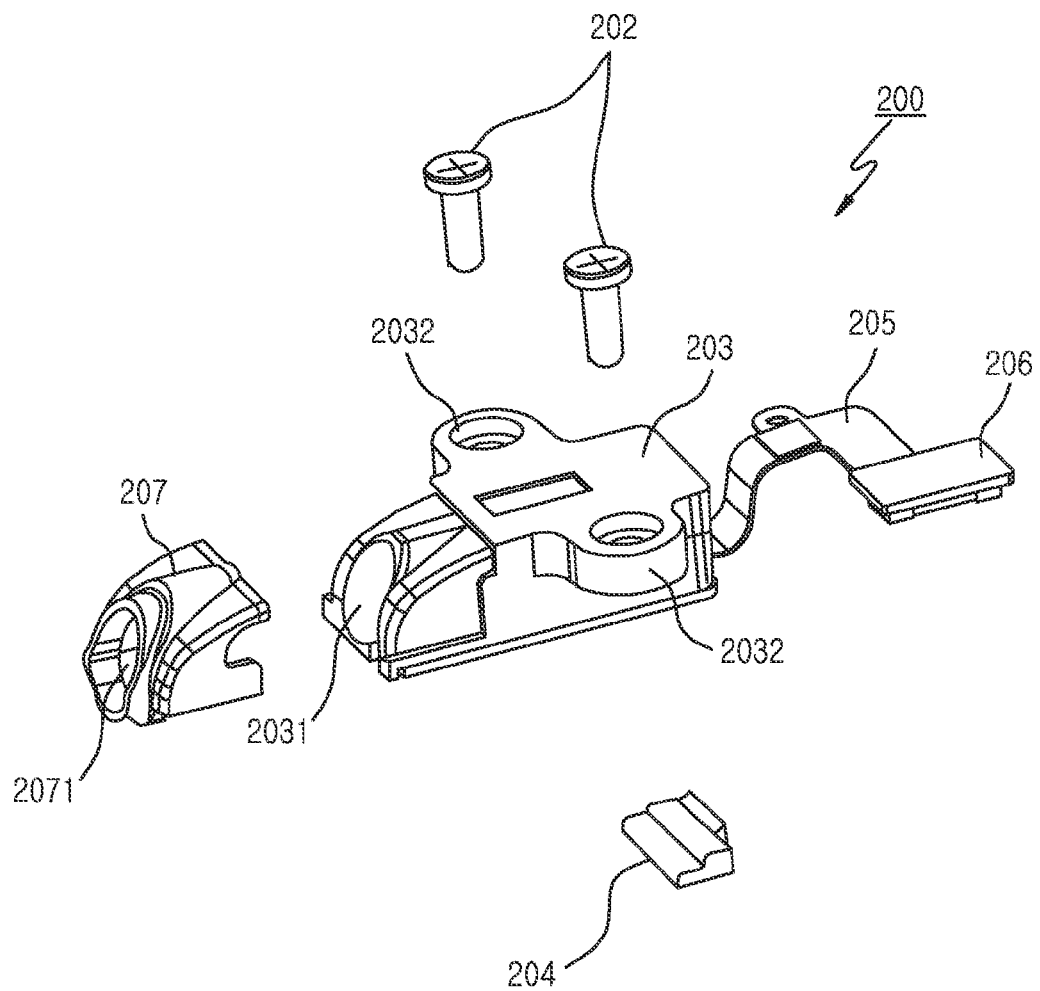
FIG. 2 is an exploded view of an ear jack assembly according to an embodiment of the present disclosure.

FIG. 2 is an exploded view of an ear jack assembly according to an embodiment of the present disclosure.

Figure 3:
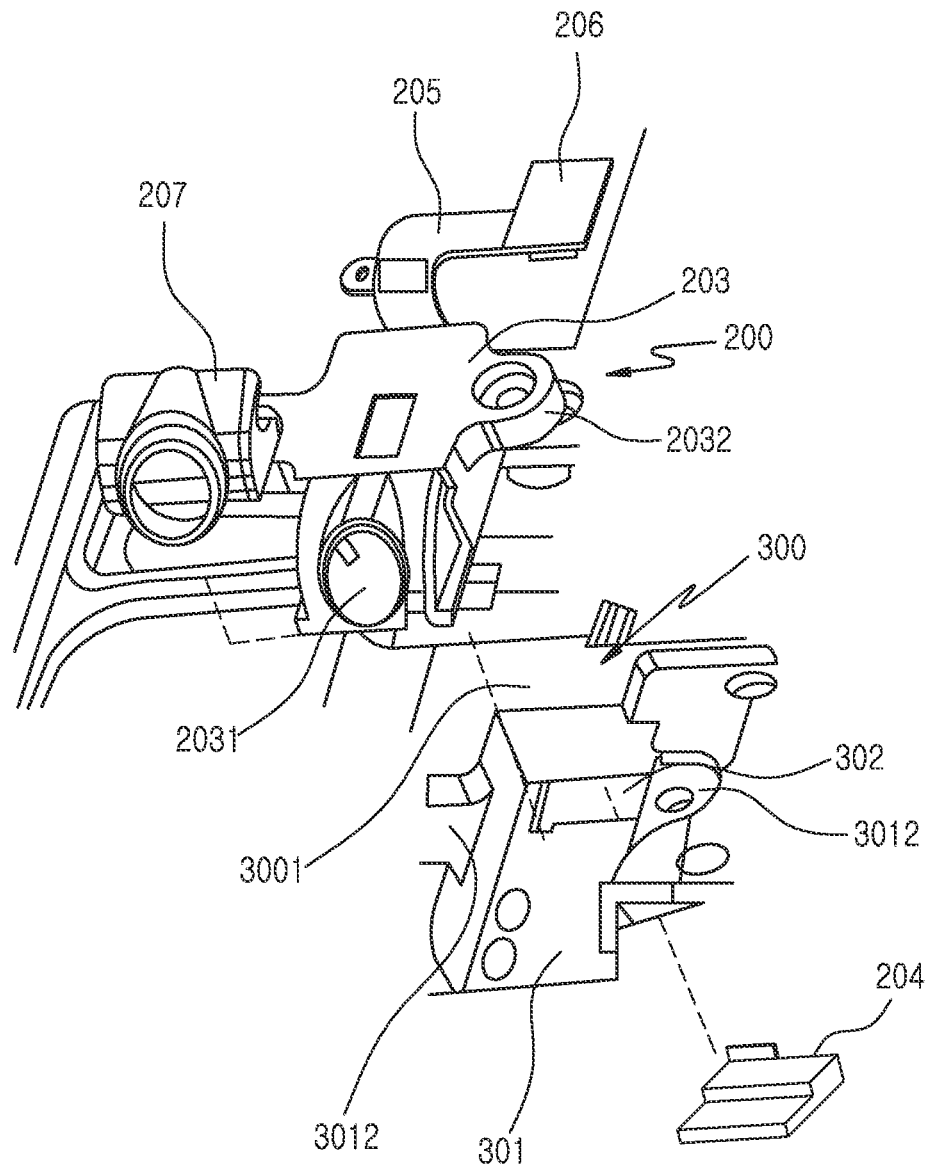
FIG. 3 is an exploded view of an ear jack assembly joined to a housing of an electronic device according to an embodiment of the present disclosure.

Referring to FIG. 2, an ear jack assembly 200 may include a body 203 including the ear jack hole 2031 for accommodating the ear plug, and a fastener 2032 formed at both ends of the body 203 and fastened to a housing, such as a housing 300 of FIG. 3. The fastener 2032 may be fastened to the housing 300 by a screw 202.

Figure 7:
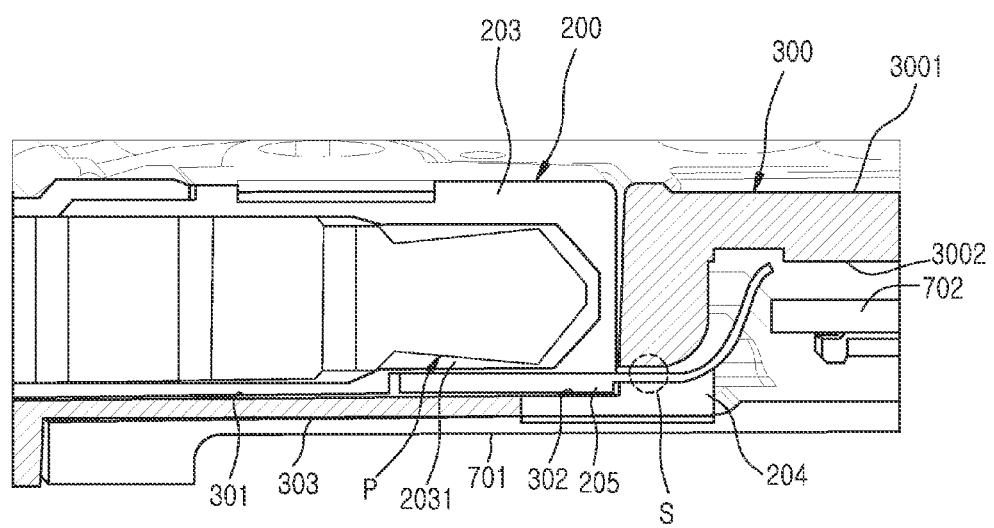
FIG. 7 is a cross-sectional view taken along A-A' of FIG. 6 according to an embodiment of the present disclosure.

A Flexible Printed Circuit Board (FPCB) 205 of a certain length may be pulled out from the body 203, and the body 203 may include a connector 206 at the body's 203 end for electrically connecting to a Printed Circuit Board (PCB), such as PCB 702 of FIG. 7, inside the electronic device 101.

An ear jack deco 207 may be further disposed at the end of the body 203, as an decorating means including an ear plug through hole 2071 for passing the ear plug. The ear jack deco 207 may be mounted to the ear jack assembly 200 and a housing, such as a housing 300 of FIG. 3 and partially exposed to the outside of the electronic device. The ear jack deco 207 may be formed of various materials such as metal material, synthetic resin material, and glass material.

The ear jack assembly 200 may be disposed in an outer side of an electronic device 101, such as outer side 3001 of the housing 300 of FIG. 3. A conventional ear jack assembly is disposed in an inner side of, for example, an electronic device 101, such as inner side 3002 of FIG. 5 of the housing 300 of FIG. 3. When the general ear jack assembly 200, not a high-priced ear jack assembly with the waterproof structure, is applied to the electronic device 101, the ear jack assembly 200 may block the external water from flowing into the electronic device 101. Since the general ear jack assembly 200 is disposed outside the electronic device 101, for example, in the outer side 3001 of the housing 300 of FIG. 3, the cost may remarkably reduce compared to the conventional waterproof ear jack assembly inside the electronic device 101.

The FPCB 205 of the ear jack assembly 200 outside the electronic device 101 must pass through the housing 300 of FIG. 3 in order to electrically connect the PCB 702 of FIG. 7 inside the electronic device. To protect them from the water, a sealing member 204 may be applied, which shall be explained in detail.

FIG. 3 is an exploded view of an ear jack assembly joined to a housing of an electronic device according to an embodiment of the present disclosure.

Figure 5:
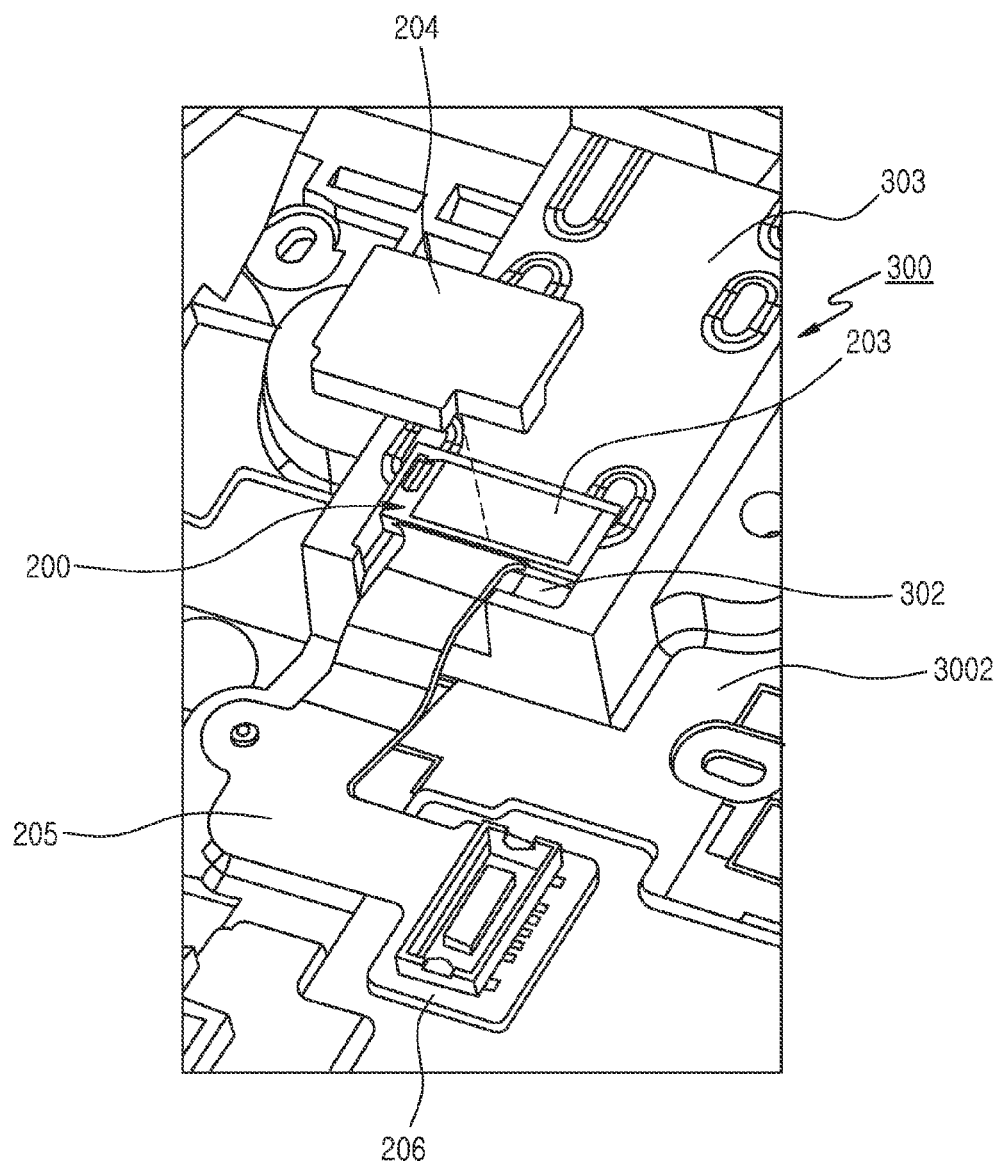
FIG. 5 is an exploded view of a sealing member joined to a housing of an electronic device according to an embodiment of the present disclosure.

Referring to FIG. 3, a housing 300 of the electronic device 101 may include the outer side 3001 for forming an exterior of the electronic device 101, and the inner side 3002 of FIG. 5 facing an interior of the electronic device 101. The outer side 3001 of the housing 300 may include a recess 301 for accommodating the body 203 of the ear jack assembly 200. The recess 301 may be formed as a groove. The recess 301 may be formed in a depth, such that the ear jack assembly 200 does not protrude at least from the outer side 3001 of the housing 300 after the body 203 of the ear jack assembly 200 is received in the recess 301. After the body 203 of the ear jack assembly 200 is received in the recess 301, the ear jack assembly 200 may match the outer side 3001 of the housing 300 in depth.

The recess 301 may include a through hole 302 through which the connector 206 and the FPCB 205 of the ear jack assembly 200 pass and come into the electronic device 101 (toward the inner side 3002 of the housing 300). The through hole 302 may be formed in a minimum size for passing the FPCB 205 and the connector 206.

The recess 301 may further include a fastener recess 3012 at both ends for accommodating the fastener 2032 of the ear jack assembly 200.

Figure 4:
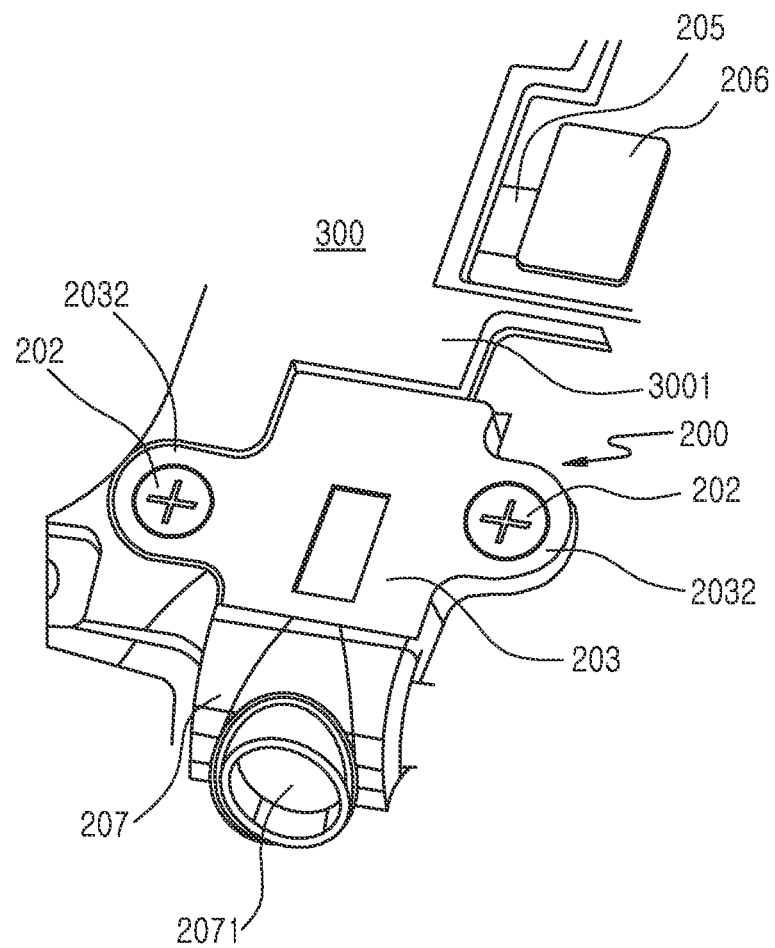
FIG. 4 is a perspective view of an ear jack assembly joined to a housing of an electronic device according to an embodiment of the present disclosure.

FIG. 4 is a perspective view of an ear jack assembly joined to a housing of an electronic device according to an embodiment of the present disclosure.

Referring to FIGS. 3 and 4, when the body 203 of the ear jack assembly 200 is received in the recess 301 of the housing 300, the fastener 2032 of the ear jack assembly 200 may be received in the fastener recess 312 of the outer side 3001 of the housing 300 and the ear jack assembly 200 may be secured to the housing 300 using the screw 202.

Before the ear jack assembly 200 is received in the recess 301 of the housing 300, the FPCB 205 and the connector 206 pass through the through hole 302 of the recess 301 to thus take them toward the inside 3002 (FIG. 5) of the housing 300.

After the ear jack assembly 200 and the ear jack deco 207 are assembled, the assembled ear jack assembly 200 and ear jack deco 207 can be mounted in the recess 301 of the outer side 3001 of the housing 300.

FIG. 5 is an exploded view of a sealing member joined to a housing of an electronic device according to an embodiment of the present disclosure.

Figure 6:
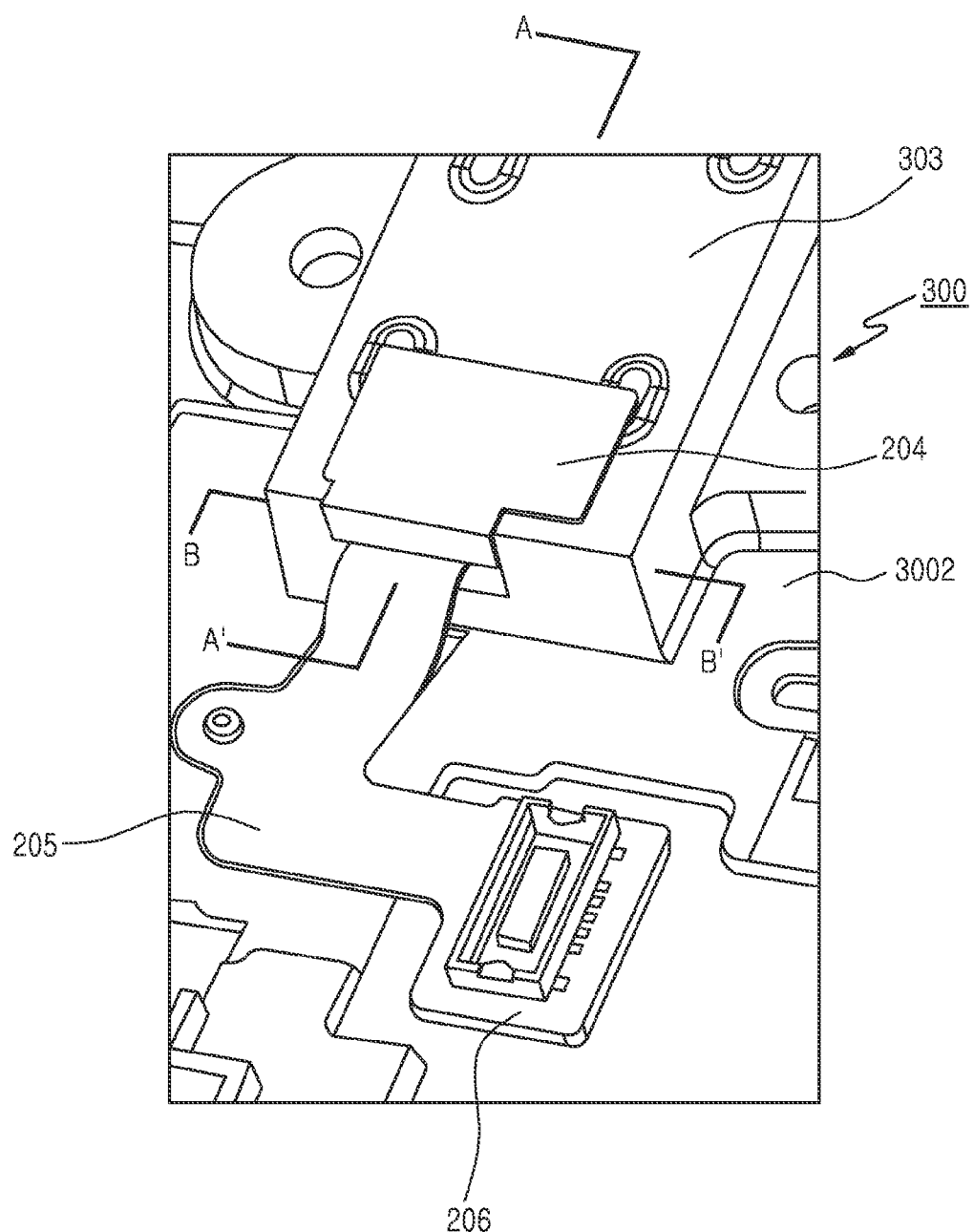
FIG. 6 is a perspective view of a sealing member joined to a housing of an electronic device according to an embodiment of the present disclosure.

FIG. 6 is a perspective view of a sealing member joined to a housing of an electronic device according to an embodiment of the present disclosure.

Referring to FIGS. 5 and 6, a sealing member 204 joined to a housing 300 includes a recess rear side 303 that may protrude from a part corresponding to the recess 301 (FIG. 3) in the inner side 3002 of the housing 300, for example, in the view from the inside of the electronic device 101. The recess rear side 303 may also include the through hole 302, and the FPCB 205 and the connector 206 of the ear jack assembly 200 disposed in the outer side 3001 of the housing 300 may be pulled in.

When the electronic device 101 is affected by the water, the water may permeate through the ear jack assembly 200 and the through hole 302 of the outer side 3001 of the housing 300. In this regard, the sealing member 204 may seal the through hole 302. The sealing member 204 may be formed of at least one of a rubber material, a silicon material, and a urethane material, and may be press-fitted into the through hole 302. Hence, when the electronic device 101 is affected by the water, the sealing member 204 may block the ingress of the water into the through hole 302 (into the electronic device 101). The sealing member 204 may be secured to the through hole 302 using bonding or double-sided tape.

FIG. 7 is a cross-sectional view taken along A-A' of FIG. 6 according to an embodiment of the present disclosure.

Figure 8:
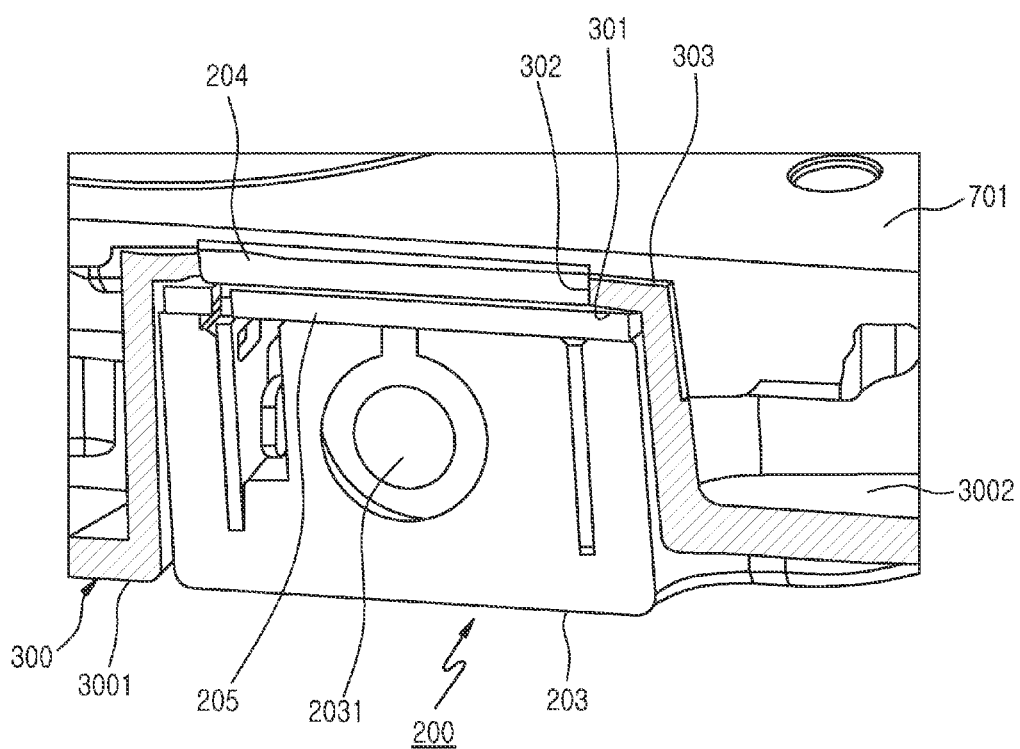
FIG. 8 is a cross-sectional view taken along B-B' of FIG. 6 according to an embodiment of the present disclosure.

FIG. 8 is a cross-sectional view taken along B-B' of FIG. 6 according to an embodiment of the present disclosure.

Referring to FIG. 7, an ear plug P is inserted to the ear jack hole 2031 of the ear jack assembly 200.

Referring to FIGS. 7 and 8, the PCB 702 may be disposed inside the electronic device 101, for example, in an area facing the inner side 3002 of the housing 300. The FPCB 205 and the connector 206 passing the through hole 302 of the recess 301 of the outer side 3001 of the housing 300 are pulled toward the PCB 702, and the connector 206 may finally contact a connector port 1301 (FIG. 12) of the PCB 702.

The sealing member 204 may seal the through hole 302 with the support of a bracket 701 in the electronic device 101. As shown in the area S of FIG. 7, the sealing member 204 may, but not limited to, closely contact the housing 300 based on the FPCB 205. The sealing member 204 may surround the edges of the corresponding area of the FPCB 205, and the waterproofing may be achieved by mounting the sealing member 204 to the through hole 302. The electronic device 101 may further include a separate auxiliary waterproofing means together with the sealing member 204. The auxiliary waterproofing means may further include a grease, a bond, a tape, and a second sealing member between the housing 300 and the FPCB 702.

Figure 9:
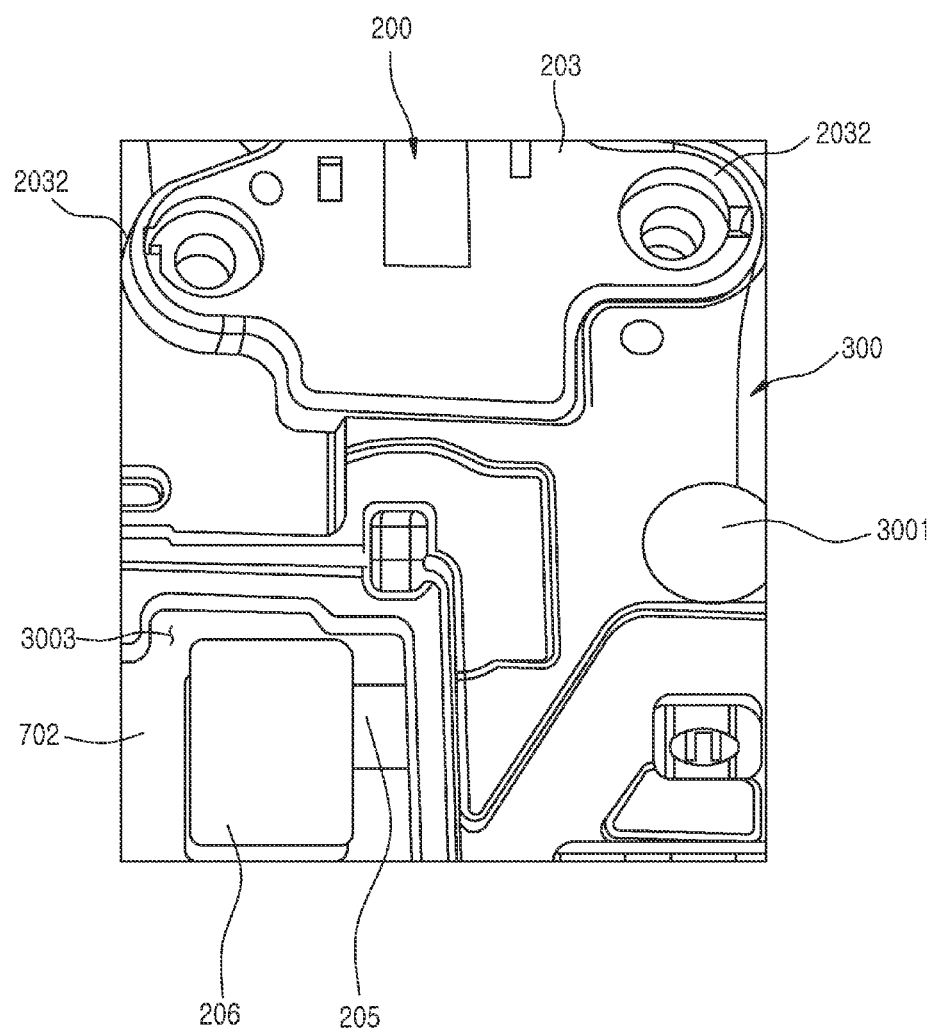
FIG. 9 is a view of a connector of an ear jack assembly connected to a Printed Circuit Board (PCB) according to an embodiment of the present disclosure.

FIG. 9 is a view of a connector of an ear jack assembly connected to a PCB according to an embodiment of the present disclosure.

Figure 10:
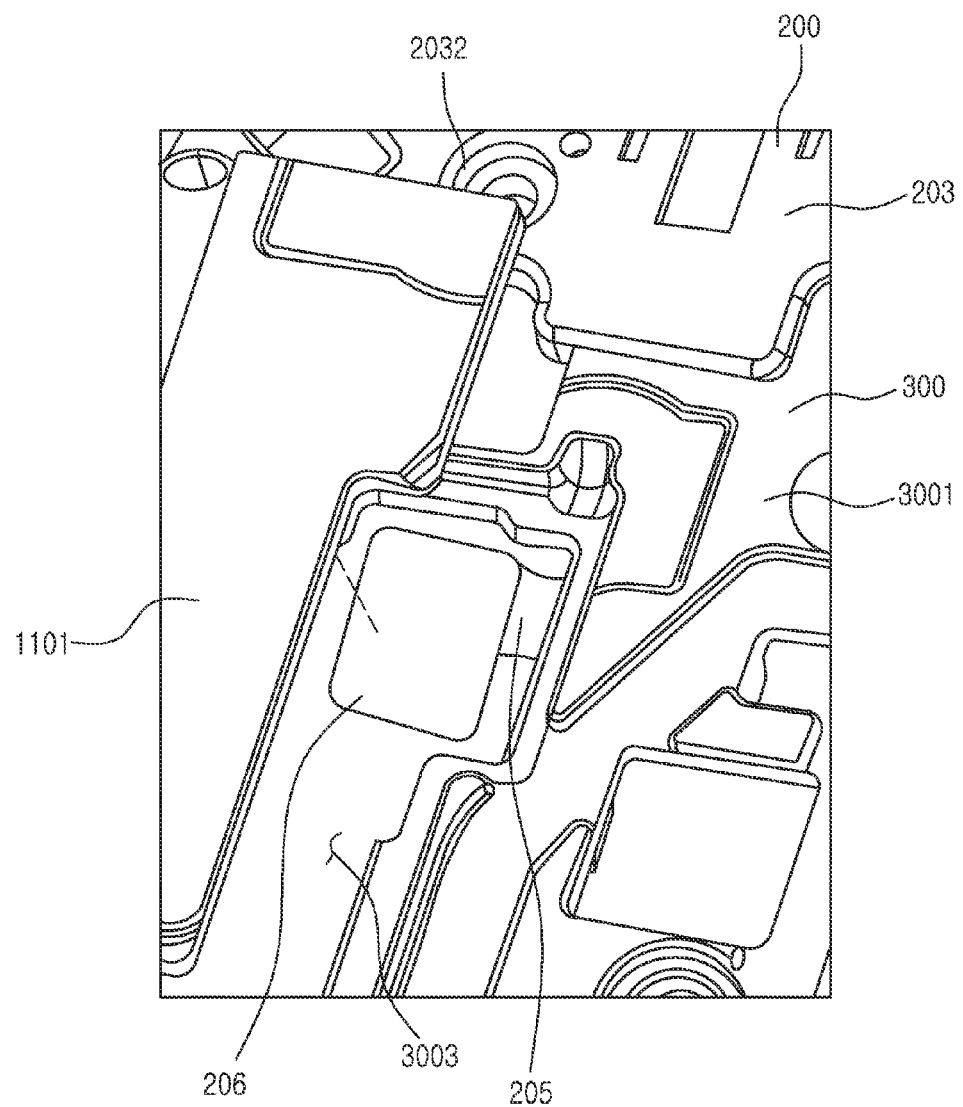
FIGS. 10 and 11 are views of a cap assembled to a housing to finish a connector joint of an ear jack assembly according to various embodiments of the present disclosure.
Figure 11:
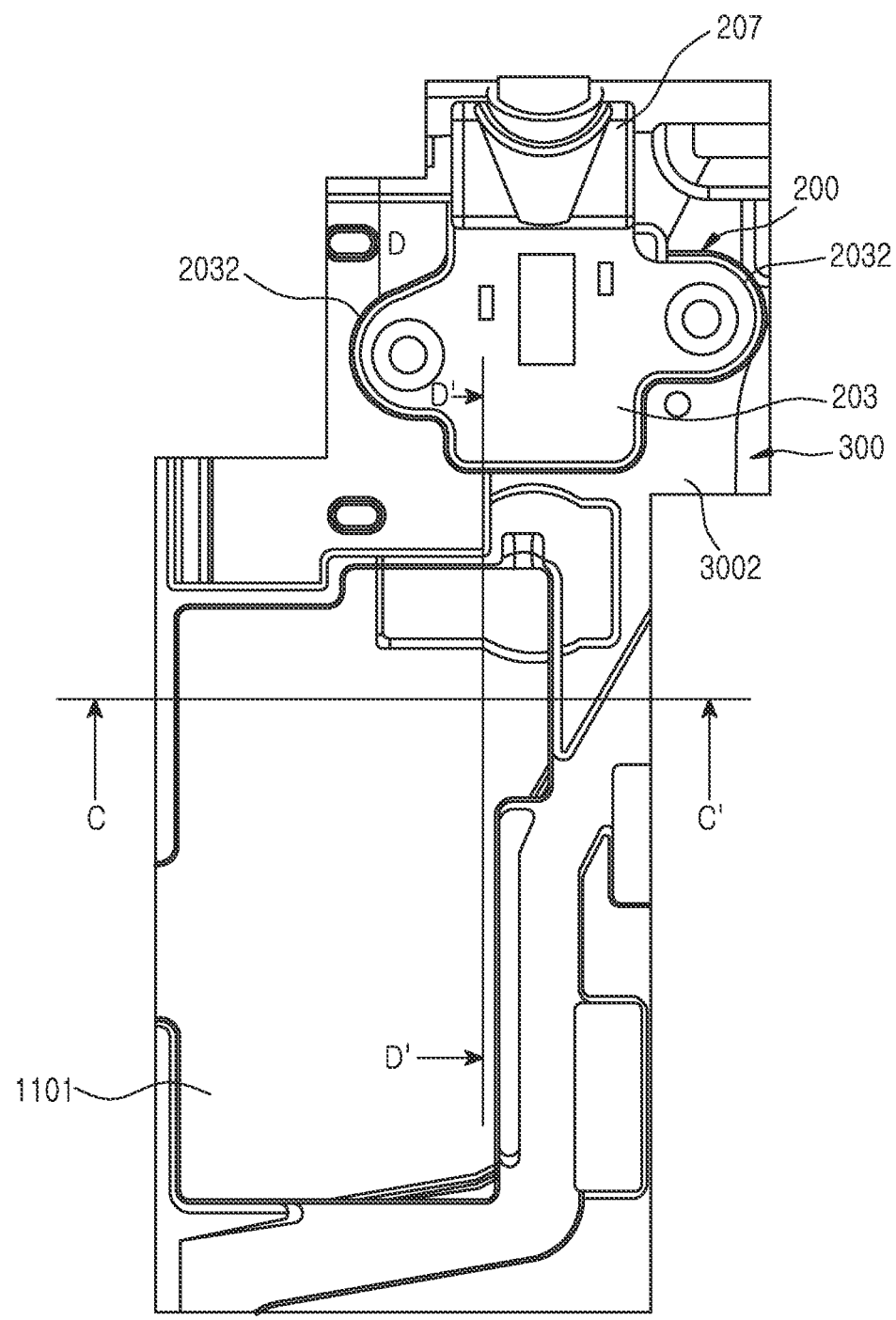

FIGS. 10 and 11 are views of a cap assembled to a housing to finish a connector joint of an ear jack assembly according to various embodiments of the present disclosure.

Figure 12:
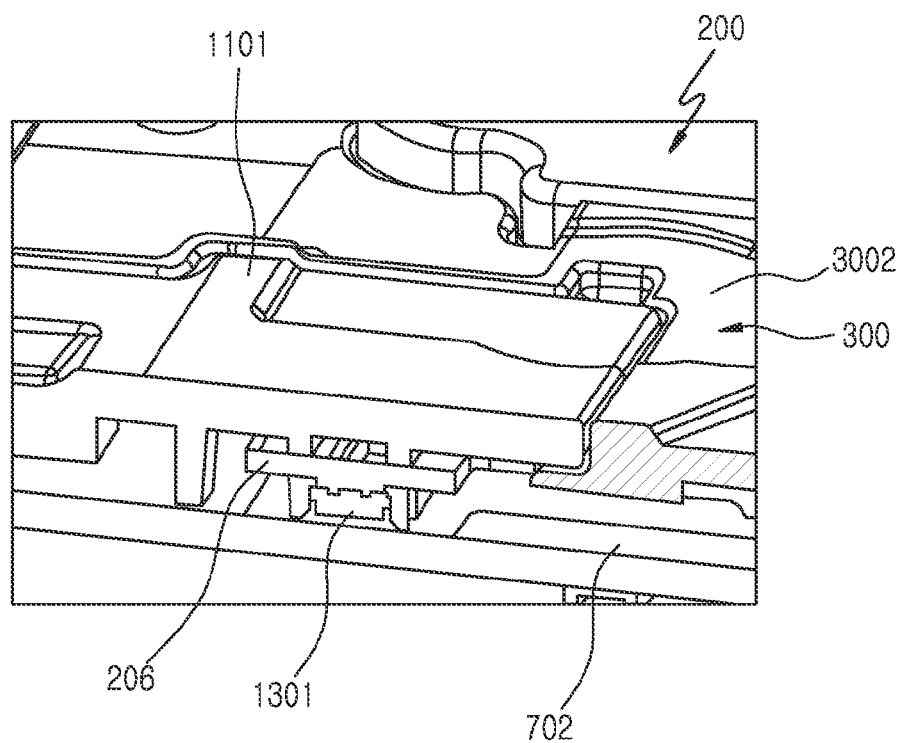
FIG. 12 is a cross-sectional view taken along C-C' of FIG. 11 according to an embodiment of the present disclosure.

FIG. 12 is a cross-sectional view taken along C-C' of FIG. 11 according to an embodiment of the present disclosure.

Figure 13:
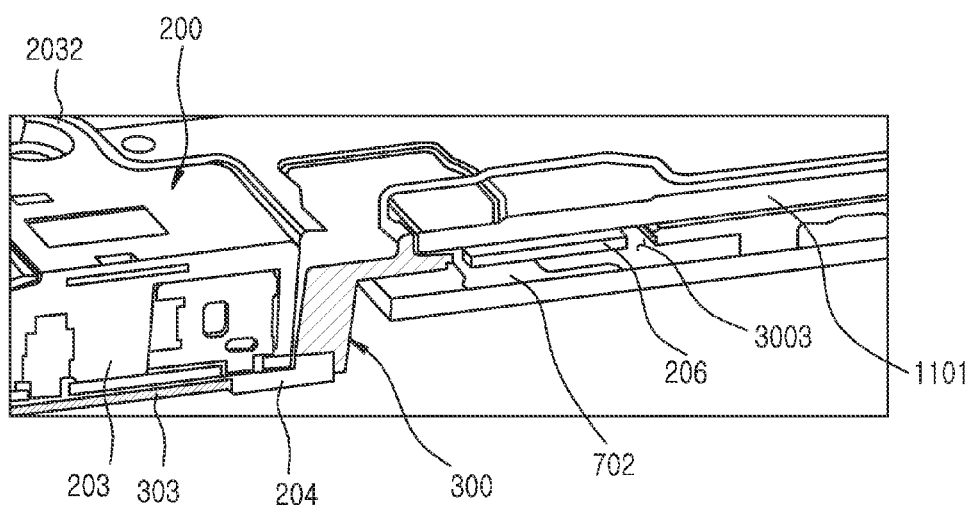
FIG. 13 is a cross-sectional view taken along D-D' of FIG. 11 according to an embodiment of the present disclosure.

FIG. 13 is a cross-sectional view taken along D-D' of FIG. 11 according to an embodiment of the present disclosure.

Referring now to FIG. 9 through FIG. 13, the outer side 3001 of the housing 300 may include an opening 3003 in a certain size. The opening 3003 may easily connect the FPCB 205 and the connector 206 of the ear jack assembly 200 pulled into the housing 300, to the PCB 702 outside the housing 300. The opening 3003 may connect and disconnect the ear jack assembly 200 to and from the PCB 702 even when the external housing 200 is assembled, and facilitates the maintenance of the various electronic components in the electronic device 101.

Since the PCB 702, part of the FPCB 205, and the connector 206 of the ear jack assembly 200 may be exposed through the opening 3003 of the housing 300, an operator may easily connect the connector 206 of the ear jack assembly 200 electrically to the PCB 702 through the opening 3003 of the housing 300, to thus enhance the assembly because there is no need to disassemble the whole electronic device 101 to connect the connector 206 of the ear jack assembly 200 to the PCB 702 in the electronic device 101.

After the connector 206 of the ear jack assembly 200 is electrically connected to the PCB 702 through the opening 3003 of the housing 300, the cap 1101 may seal the opening 3003 in order to block a foreign substance or the water from permeating into the electronic device 101. The cap 1101 may be press-fitted to the opening 3003. In this case, the cap 1101 may be formed of at least one of, but not limited to, rubber, silicon, and urethane with elasticity. The cap 1101 may be formed of a synthetic resin material or a metal material, and secured to the housing using at least one of the bonding, the double-sided taping, and the screw fastening.

As such, since the electronic components are mounted outside the electronic device 101 and the waterproofing is realized, the device may be slimmed, the manufacturing cost may be reduced, and the assembling may be enhance.

Figure 14:
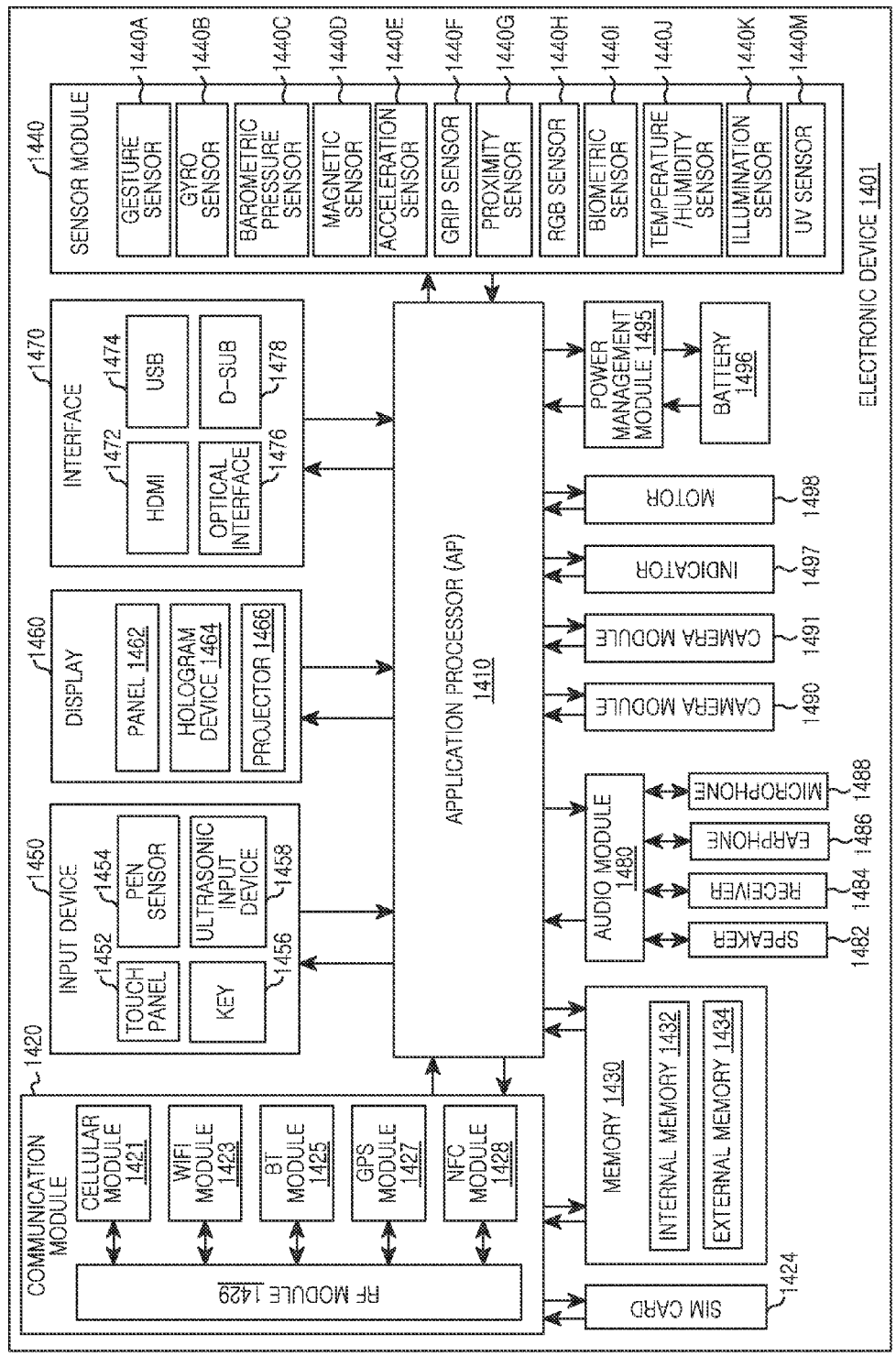
FIG. 14 is a block diagram of an electronic device according to an embodiment of the present disclosure.

FIG. 14 is a block diagram of an electronic device according to an embodiment of the present disclosure.

Referring to FIG. 14, an electronic device 1401 may configure all or part of, for example, the electronic device 101 of FIG. 1. The electronic device 1401 may include one or more Application Processors (APs) 1410, a communication module 1420, a Subscriber Identity Module (SIM) card 1424, a memory 1430, a sensor module 1440, an input device 1450, a display 1460, an interface 1470, an audio module 1480, camera modules 1490 and 1491, a power management module 1495, a battery 1496, an indicator 1497, and a motor 1498.

The AP 1410 may control a plurality of hardware or software components connected to the AP 1410 by driving an operating system or an application program, and carry out various data processing and operations including multimedia data. The AP 1410 may be implemented using, for example, a System on Chip (SoC). The processor 1410 may further include a Graphic Processing Unit (GPU) (not shown).

The communication module 1420 (e.g., the communication interface 160) may transmit and receive data in the communications between the electronic device 1401 (e.g., the electronic device 101) and other electronic devices (e.g., the electronic device 104 or the server 106) connected via a network. The communication module 1420 may include a cellular module 1421, a Wifi module 1423, a BT module 1425, a GPS module 1427, an NFC module 1428, and a Radio Frequency (RF) module 1429.

The cellular module 1421 may provide a voice call, a video call, a text message service, or an Internet service over the communication network (e.g., LTE, LTE-A, CDMA, WCDMA, UMTS, WiBro, or GSM). Also, the cellular module 1421 may identify and authenticate the electronic device in the communication network using a subscriber identity module (e.g., the SIM card 1424). The cellular module 1421 may perform at least part of functions provided by the AP 1421. For example, the cellular module 1421 may perform at least part of a multimedia control function.

The cellular module 1421 may include a Communication Processor (CP). Also, the cellular module 1421 may be implemented using, for example, the SoC. While the components of the cellular module 1421 (e.g., the communication processor), the memory 1430, or the power management module 1495 are depicted separately from the AP 1410 in FIG. 14, the AP 1410 may include at least part (e.g., the cellular module 1421) of the above-stated components according to an embodiment.

The AP 1410 or the cellular module 1421 (e.g., the communication processor) may load and process the instruction or the data received from the AP's 1410 or the cellular module's 1421 connected non-volatile memory or at least one of the other components, in a volatile memory. Also, the AP 1410 or the cellular module 1421 may store data received from at least one of the other components or generated by at least one of the other components, in the non-volatile memory.

The Wifi module 1423, the BT module 1425, the GPS module 1427, or the NFC module 1428 each may include, for example, a processor for processing the data transmitted and received via the corresponding module. While the cellular module 1421, the Wifi module 1423, the BT module 1425, the GPS module 1427, or the NFC module 1428 is depicted as the separate block in FIG. 14, at least part (e.g., at least two) of the cellular module 1421, the Wifi module 1423, the BT module 1425, the GPS module 1427, or the NFC module 1428 may be included in a single Integrated Chip (IC) or an IC package. For example, at least part (e.g., the communication processor corresponding to the cellular module 1421 and the Wifi processor corresponding to the Wifi module 1423) of the processors corresponding to the cellular module 1421, the Wifi module 1423, the BT module 1425, the GPS module 1427, or the NFC module 1428 may be implemented using a single SoC.

The RF module 1429 may transmit and receive the data, for example, RF signals. The RF module 1429 may include, for example, a transceiver, a Power Amp Module (PAM), a frequency filter, or a Low Noise Amplifier (LNA) which is not shown. Also, the RF module 1429 may further include a component for sending and accommodating electromagnetic waves in free space during the wireless communication, for example, a conductor or a conducting wire. While the cellular module 1421, the Wifi module 1423, the BT module 1425, the GPS module 1427, and the NFC module 1428 share the single RF module 1429 in FIG. 14, at least one of the cellular module 1421, the Wifi module 1423, the BT module 1425, the GPS module 1427, or the NFC module 1428 may transmit and receive the RF signals via a separate RF module.

The SIM card 1424 may be a card including the subscriber identity module and be inserted to a slot formed at a specific location of the electronic device. The SIM card 1424 may include unique identification information (e.g., Integrated Circuit Card Identifier (ICCID)) or subscriber information (e.g., International Mobile Subscriber Identity (IMSI)).

The memory 1430 (e.g., the memory 130) may include an internal memory 1432 or an external memory 1434. The internal memory 1432 may include at least one of, for example, the volatile memory (e.g., Dynamic RAM (DRAM), Static RAM (SRAM), Synchronous Dynamic RAM (SDRAM)) or the non-volatile memory (e.g., One-Time Programmable ROM (OTPROM), Programmable ROM (PROM), Erasable and Programmable ROM (EPROM), Electrically Erasable and Programmable ROM (EEPROM), mask ROM, flash ROM, NAND flash memory, NOR flash memory).

The internal memory 1432 may be a Solid State Drive (SSD). The external memory 1434 may include a flash drive, for example, a Compact Flash (CF), a Secure Digital (SD), a Micro-Secure Digital (SD), a Mini-SD, an extreme digital (xD), or a memory stick. The external memory 1434 may be functionally connected to the electronic device 1401 via various interfaces. The electronic device 1401 may further include a storage device (or a storage medium) such as hard drive.

The sensor module 1440 may measure a physical quantity or detect the operation status of the electronic device 1401, and convert the measured or detected information to an electric signal. The sensor module 1440 may include at least one of, for example, a gesture sensor 1440A, a gyro sensor 1440B, an atmospheric pressure sensor 1440C, a magnetic sensor 1440D, an acceleration sensor 1440E, a grip sensor 1440F, a proximity sensor 1440G, a color sensor 1440H (e.g., Red Green Blue (RGB) sensor), a biometric sensor 1440I, a temperature/humidity sensor 1440J, a light sensor 1440K, or an UltraViolet (UV) sensor 1440M. Additionally/substantially, the sensor module 1440 may include, for example, an E-noise sensor (not shown), an electromyography (EMG) sensor (not shown), an electroencephalogram (EEG) sensor (not shown), an electrocardiogram (ECG) sensor (not shown), an Infra Red (IR) sensor (not shown), an iris sensor (not shown), or a finger print sensor (not shown). The sensor module 1440 may further include a control circuit for controlling the sensor module's 1440 one or more sensors.

The input device 1450 may include a touch panel 1452, a (digital) pen sensor 1454, a key 1456, or an ultrasonic input device 1458. For example, the touch panel 1452 may recognize touch input using at least one of capacitive, resistive, infrared, and ultrasonic wave techniques. Also, the touch panel 1452 may further include a controller. The capacitive type may recognize physical contact or proximity. The touch panel 1452 may further include a tactile layer. In this case, the touch panel 1452 may provide a tactile response to the user.

The (digital) pen sensor 1454 may be implemented using, for example, the same or similar method as or to the user's touch input, or using a separate recognition sheet. For example, the key 1456 may include, for example, a physical button, an optical key, or a keypad. The ultrasonic input device 1458 is a device capable of obtaining data by detecting microwaves through a microphone (e.g., a microphone 1488) in the electronic device 1401 through an input tool which generates an ultrasonic signal, allows radio frequency identification. The electronic device 1401 may receive user input from an external device (e.g., a computer or a server) connected using the communication module 1420.

The display 1460 (e.g., the display 150) may include a panel 1462, a hologram device 1464, or a projector 1466. The panel 1462 may employ, for example, a Liquid-Crystal Display (LCD) or an Active-Matrix Organic Light-Emitting Diode (AMOLED). The panel 1462 may be implemented, for example, flexibly, transparently, or wearably. The panel 1462 may be constructed as the single module with the touch panel 1452. The hologram device 1464 may present a three-dimensional image in the air using interference of light. The projector 1466 may display the image by projecting the light onto a screen. The screen may be placed, for example, inside or outside the electronic device 1401. The display 1460 may further include a control circuit for controlling the panel 1462, the hologram device 1464, or the projector 1466.

The interface 1470 may include, for example, a High-Definition Multimedia Interface (HDMI) 1472, a Universal Serial Bus (USB) 1474, an optical interface 1476, or a D-subminiature (D-sub) 1478. The interface 1470 may be included in, for example, the communication interface 160 of FIG. 1. Additionally/substantially, the interface 1470 may include, for example, Mobile High-Definition Link (MHL)

interface, Secure Digital (SD) card/Multi-Media Card (MMC) interface, or Infrared Data Association (IrDA) standard interface.

The audio module 1480 may convert sound to an electric signal and vice versa. At least part of the audio module 1480 may be included in, for example, the input/output interface 140 of FIG. 1. The audio module 1480 may process sound information which is input or output through, for example, a speaker 1482, a receiver 1484, an earphone 1486, or the microphone 1488.

The camera module 1491 is a device for capturing a still picture and a moving picture, and may include one or more image sensors (e.g., a front sensor or a rear sensor), a lens (not shown), an Image Signal Processor (ISP) (not shown), or a flash (e.g., LED or xenon lamp) (not shown).

The power management module 1495 may manage power of the electronic device 1401. The power management module 1495 may include, although not depicted, for example, a Power Management Integrated Circuit (PMIC), a charger Integrated Circuit (IC), or a battery fuel gauge.

The PMIC may be mounted in, for example, an IC or a SoC conductor. The charging type may be divided to a wired type and a wireless type. The charger IC may charge the battery, and prevent overvoltage or overcurrent flow from the charger. The charger IC may include a charger IC for at least one of the wired charging type or the wireless charging type. The wireless charging type includes, for example, a magnetic resonance type, a magnetic induction type, or a microwave type, and may add an additional circuit for the wireless charging, for example, a circuit such as coil loop, resonance circuit, or rectifier.

The battery gauge may, for example, measure the remaining capacity of the battery 1496 and the voltage, the current, or the temperature of the charging. The battery 1496 can generate or store electricity, and supply the power to the electronic device 1401 using the stored or generated electricity. The battery 1496 may include, for example, a rechargeable battery or a solar battery The indicator 1497 may display a specific status of the electronic device 1401 or indicator's 1497 part (e.g., the AP 1410), for example, booting state, message state, or charging state. The motor 1498 may convert the electric signal to a mechanic vibration. Although it is not depicted, the electronic device 1401 may include a processing device (e.g., a GPU) for mobile TV support. The processing device for the mobile TV support may process media data in conformity to a standard, for example, Digital Multimedia Broadcasting (DMB), Digital Video Broadcasting (DVB), or media flow.

The aforementioned components of the electronic device according to various embodiments of the present disclosure each may include one or more components, and the name of the corresponding component may differ according to the type of the electronic device. The electronic device according to various embodiments of the present disclosure may include at least one of the aforementioned components, omit some components, or further include other components. Also, some of the components of the electronic device according to various embodiments of the present disclosure may be united into a single entity to thus carry out the same functions of the corresponding components.

The term "module" used in various embodiments of the present disclosure may indicate, for example, a unit including a combination of one or more of hardware, software, or firmware. The "module" may be interchangeably used with the term, for example, a unit, logic, a logical block, a component, or a circuit. The "module" may be a minimum unit or part of the components integrally formed. The "module" may be a minimum unit or part for one or more functions. The "module" may be implemented mechanically or electronically. For example, the "module" in the present disclosure may include at least one of an Application-Specific Integrated Circuit (ASIC) chip, Field-Programmable Gate Arrays (FPGAs), or a programmable-logic device for performing operations which are well known or to be invented.

At least part of the apparatus (e.g., modules or functions) or the method (e.g., operations) according to various embodiments of the present disclosure may be implemented as, for example, instructions stored in computer-readable storage media in the form of the programming module. When the instruction is executed by one or more processors (e.g., the processor 120), the one or more processors may perform the function corresponding to the instruction. The computer-readable storage medium may be, for example, the memory 130. At least part of the programming module may be realized (e.g., executed) by, for example, the processor 120. At least part of the programming module may include, for example, a module, a program, a routine, sets of instructions, or a process for one or more functions.

At least part of the device (e.g., modules or functions) or the method (e.g., operations) according to various embodiments of the present disclosure may be implemented as, for example, an instruction stored in a computer-readable storage media in the form of a programming module. When the instruction is executed by one or more processor (e.g., the processor 120), the one or more processors may perform a function corresponding to the instruction. The computer-readable storage medium may be, for example, the memory 130. At least part of the programming module may be implemented by the processor 120. At least part of the programming module may include, for example, a module, a program, sets of instructions, or a process for performing one or more functions.

The computer-readable recording medium may include magnetic media such as hard disk, floppy disk and magnetic tape, optical media such as Compact Disc Read Only Memory (CD-ROM) and Digital Versatile Disc (DVD), magneto-optical media such as floptical disk, and hardware devices specifically configured to store and execute the program instruction (e.g., the programming module) such as Read Only Memory (ROM), Random Access Memory (RAM), and flash memory. Also, the program instruction may include not only a machine code made by a complier but also a high-level language code executable by a computer using an interpreter. The above-stated hardware device may serve as one or more software modules for fulfilling the operations of various embodiments of the present disclosure, and vice versa.

The module or the programming module according to various embodiments of the present disclosure may include at least one of the aforementioned components, omit some components, or further include other components. The operations fulfilled by the modules, the programming modules, or other components according to various embodiments of the present disclosure may be carried out in sequence, in parallel, repeatedly, or heuristically. Also, some operations may be executed in a different order or omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   an electronic component electrically connected to a printed circuit board (PCB);
   a housing comprising an outer side and an inner side which is opposed to the outer side and faces an interior of the electronic device;
   a recess formed in the outer side of the housing, configured to accommodate the electronic component and comprising a hole, at least part of the hole being connected into the electronic device;
   a sealing member configured to:
      seal the hole of the housing, and
      cover at least part of the PCB;
   an opening formed in the housing and spaced apart from the hole of the housing; and
   a cap covering the opening and blocking permeation of a foreign substance and water into the opening,
   wherein the PCB passing through the hole is exposed through the opening of the housing, and electrically connected into the electronic device through the opening when the electronic component is coupled to the recess of the housing.

2. The electronic device of claim 1, wherein the electronic component is electrically connected to a main PCB in the housing through the hole.

3. The electronic device of claim 1, wherein the PCB is a flexible printed circuit board (FPCB) electrically connected to a main PCB in the housing.

4. The electronic device of claim 1, wherein the electronic component comprises at least one of a micro universal serial bus (USB) connector port, a general USB connector port, an ear jack assembly, a key button, a card slot configured to insert an external card-type device, a high-definition multimedia interface (HDMI) connector port, a sensor module, or a microphone.

5. An electronic device comprising:
   a housing comprising an outer side and an inner side, the inner side being opposed to the outer side and facing an interior of the electronic device;
   at least one electronic component disposed in the outer side of the housing;
   an electrical connector configured to electrically connect the at least one electronic component to a printed circuit board (PCB) disposed in the interior of the housing by passing through a hole formed from the outer side to the inner side of the housing;
   a sealing member configured to seal the hole in the housing;
   an opening formed in the housing and spaced apart from the hole of the housing; and
   a cap covering the opening and blocking permeation of a foreign substance and water into the opening,
   wherein the electrical connector passing through the hole is exposed through the opening of the housing and electrically connected to the PCB disposed in the interior of the housing through the opening when the electronic component is coupled to the outer side of the housing.

6. The electronic device of claim 5,
   wherein the housing further comprises a recess configured to mount the at least one electronic component.

7. The electronic device of claim 6, wherein the recess comprises the hole configured to pass the electrical connector.

8. The electronic device of claim 7, wherein the sealing member is mounted to the hole using at least one of a press fit, an adhesion with bonding, or a double-sided tape.

9. The electronic device of claim 7, wherein the hole is sealed by the sealing member in the inner side opposed to the outer side of the housing.

10. The electronic device of claim 6, wherein the at least one electronic component being mounted in the recess is less than or equal to the outer side of the housing.

11. The electronic device of claim 5, wherein the sealing member is formed of at least one of rubber, silicon, or urethane.

12. The electronic device of claim 5, wherein the electrical connector comprises at least one of a flexible printed circuit (FPC) or a thin cable.

13. The electronic device of claim 5, wherein the at least one electronic component comprises at least one of a micro universal serial bus (USB) connector port, a general USB connector port, an ear jack assembly, a key button, a card slot for inserting an external card-type device, a high-definition multimedia interface (HDMI) connector port, a sensor module, or a microphone.

14. An electronic device comprising:
   a housing comprising an outer side and an inner side, the inner side being opposed to the outer side and facing an interior of the electronic device;
   a recess formed in the outer side of the housing and comprising a through hole of which at least part is connected into the housing;
   at least one electronic component received in the recess;
   an electrical connector electrically connected to the at least one electronic component with one end, and electrically connected into the electronic device by passing through the through hole with the other end;
   a sealing member configured to seal the through hole after the at least one electronic component is mounted in the recess;
   an opening formed in the housing and spaced apart from the through hole of the housing; and
   a cap covering the opening and blocking permeation of a foreign substance and water into the opening,
   wherein the electrical connector passing through the through hole is exposed through the opening of the housing, and electrically connected into the electronic device through the opening when the electronic component is coupled to the recess of the housing.

15. The electronic device of claim 14, wherein the through hole is sealed by the sealing member in the inner side of the housing.

16. The electronic device of claim 14, wherein the electrical connector comprises at least one of a flexible printed circuit (FPC) or a thin cable.

17. The electronic device of claim 14, wherein the at least one electronic component comprises at least one of a micro universal serial bus (USB) connector port, a general USB connector port, an ear jack assembly, a key button, a card slot configured to insert an external card-type device, a high-definition multimedia interface (HDMI) connector port, a sensor module, or a microphone.

18. The electronic device of claim 14, wherein the at least one electronic component comprises an ear jack deco.

* * * * *